US012689312B2

(12) United States Patent
Suzuki et al.

(10) Patent No.: US 12,689,312 B2
(45) Date of Patent: Jul. 21, 2026

(54) METHOD FOR MANUFACTURING VIBRATION POWER GENERATION DEVICE AND VIBRATION DEVICE

(71) Applicant: SEIKO EPSON CORPORATION, Tokyo (JP)

(72) Inventors: Katsuya Suzuki, Suwa (JP); Yukio Yamauchi, Chino (JP); Takashi Miyata, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 169 days.

(21) Appl. No.: 18/826,591

(22) Filed: Sep. 6, 2024

(65) Prior Publication Data

US 2025/0088124 A1      Mar. 13, 2025

(30) Foreign Application Priority Data

Sep. 7, 2023      (JP) ................................. 2023-145328

(51) Int. Cl.
| | |
|---|---|
| *H02N 1/08* | (2006.01) |
| *H01G 7/02* | (2006.01) |
| *H10D 64/00* | (2025.01) |
| *H10P 90/00* | (2026.01) |
| *H10W 10/10* | (2026.01) |

(52) U.S. Cl.
CPC .............. *H02N 1/08* (2013.01); *H01G 7/026* (2013.01); *H10D 64/118* (2025.01); *H10P 90/1914* (2026.01); *H10W 10/181* (2026.01)

(58) Field of Classification Search
CPC ....... A47J 31/46; H01G 5/0136; H01G 7/026; H02N 1/08; H10D 64/118; H10P 90/1914; H10W 10/181
See application file for complete search history.

(56) References Cited

U.S. PATENT DOCUMENTS

2009/0140443 A1* 6/2009 Hohlfeld ................. H02N 1/08
                                                              438/669

FOREIGN PATENT DOCUMENTS

| | | |
|---|---|---|
| JP | 2023-91647 A | 6/2023 |
| JP | 2023-91648 A | 6/2023 |
| JP | 2023091647 A * | 6/2023 |
| JP | 2023-107340 A | 8/2023 |
| JP | 2023-107341 A | 8/2023 |
| JP | 2024-17551 A | 2/2024 |

OTHER PUBLICATIONS

JP-2023091647-A, all pages (Year: 2023).*

* cited by examiner

*Primary Examiner* — Naishadh N Desai
(74) *Attorney, Agent, or Firm* — Rankin, Hill & Clark LLP

(57)                    ABSTRACT

A method for manufacturing a vibration power generation device includes: first silicon substrate patterning for patterning a first silicon substrate to form a first support portion and a fixed electrode finger; second silicon substrate patterning for patterning a second silicon layer of a second silicon substrate in which a first silicon layer and the second silicon layer are laminated to form a movable electrode finger and patterning the first silicon layer to form a second support portion and a movable portion; electret film forming for forming an electret film at one of the movable electrode finger and the fixed electrode finger; and bonding for bonding the first silicon substrate to the second silicon layer side of the second silicon substrate such that the movable electrode finger and the fixed electrode finger face each other.

7 Claims, 9 Drawing Sheets

FIG. 2

```
        START

FIRST SILICON SUBSTRATE PATTERNING — S1

SECOND SILICON SUBSTRATE PATTERNING — S2

ELECTRET FILM FORMING — S3

BONDING — S4

END
```

FIG. 7
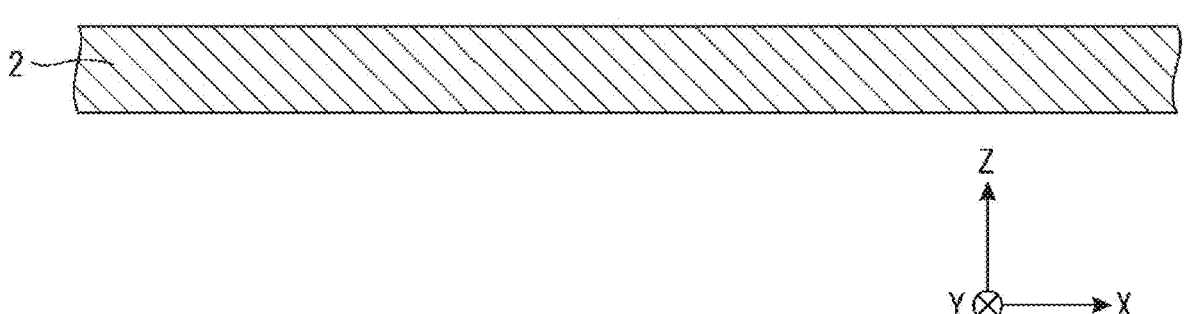
FIG. 8
FIG. 9
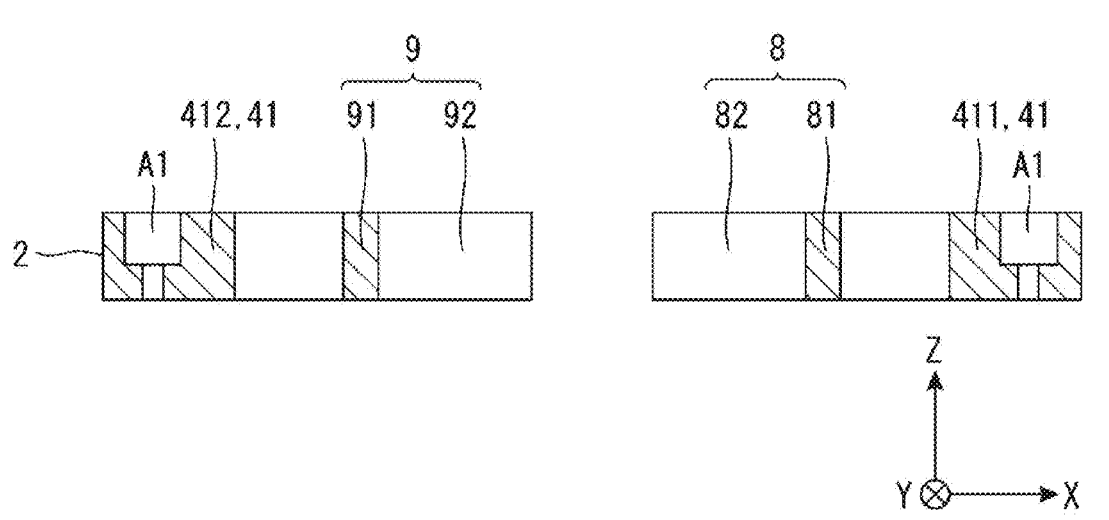

METHOD FOR MANUFACTURING VIBRATION POWER GENERATION DEVICE AND VIBRATION DEVICE

The present application is based on, and claims priority from JP Application Serial Number 2023-145328, filed Sep. 7, 2023, the disclosure of which is hereby incorporated by reference herein in its entirety.

BACKGROUND

1. Technical Field

The present disclosure relates to a method for manufacturing a vibration power generation device and a vibration device.

2. Related Art

JP-A-2023-091647 describes a power generation vibration element formed by patterning a silicon on insulator (SOI) substrate by a semiconductor process. The SOI substrate is a substrate in which a silicon oxide layer as a BOX layer is inserted between a first silicon layer as a handle layer and a second silicon layer as a device layer. In addition, the power generation vibration element includes a support portion, a spring portion coupled to the support portion, a movable portion coupled to the support portion via the spring portion, a movable electrode coupled to the movable portion, and a fixed electrode coupled to the support portion. In addition, a negatively charged electret film is formed at the movable electrode. In such a vibration power generation element, when an external force is applied, the movable portion vibrates while elastically deforming the spring portion, and power generation is performed by changing the capacitance between the movable electrode and the fixed electrode due to the vibration.

However, in the above-described power generation vibration element, both the movable electrode and the fixed electrode are formed from the second silicon layer. Therefore, after the movable electrode and the fixed electrode are patterned by a semiconductor process, it is necessary to selectively form the electret film only at the movable electrode in a state where the movable electrode and the fixed electrode are meshed with each other at a narrow pitch. Therefore, there is a problem that it is difficult to form an electret film.

SUMMARY

According to an aspect of the present disclosure, a method for manufacturing a vibration power generation device including a support portion having a first support portion and a second support portion, a movable portion that is displaced in a first direction with respect to the support portion, a movable electrode finger coupled to the movable portion, and a fixed electrode finger coupled to the support portion, the method includes:

first silicon substrate patterning for patterning a first silicon substrate by etching to form the first support portion and the fixed electrode finger;

second silicon substrate patterning for patterning a second silicon layer of a second silicon substrate in which a first silicon layer and the second silicon layer are laminated by etching to form the movable electrode finger and patterning the first silicon layer by etching to form the second support portion and the movable portion;

electret film forming for forming an electret film at one of the movable electrode finger and the fixed electrode finger; and bonding for bonding the first silicon substrate to the second silicon layer side of the second silicon substrate such that the movable electrode finger and the fixed electrode finger face each other.

According to another aspect of the present disclosure, a vibration device includes:

a support portion having a first support portion and a second support portion;

a movable portion that is displaced in a first direction with respect to the support portion;

a movable electrode finger coupled to the movable portion; and a fixed electrode finger coupled to the support portion, in which the first support portion and the fixed electrode finger are provided on a first silicon substrate, the movable electrode finger is provided on the first silicon layer in a second silicon substrate on which the first silicon layer and a second silicon layer are laminated, and the second support portion and the movable portion are provided on the second silicon layer in the second silicon substrate.

BRIEF DESCRIPTION OF THE DRAWINGS

Figure 2:
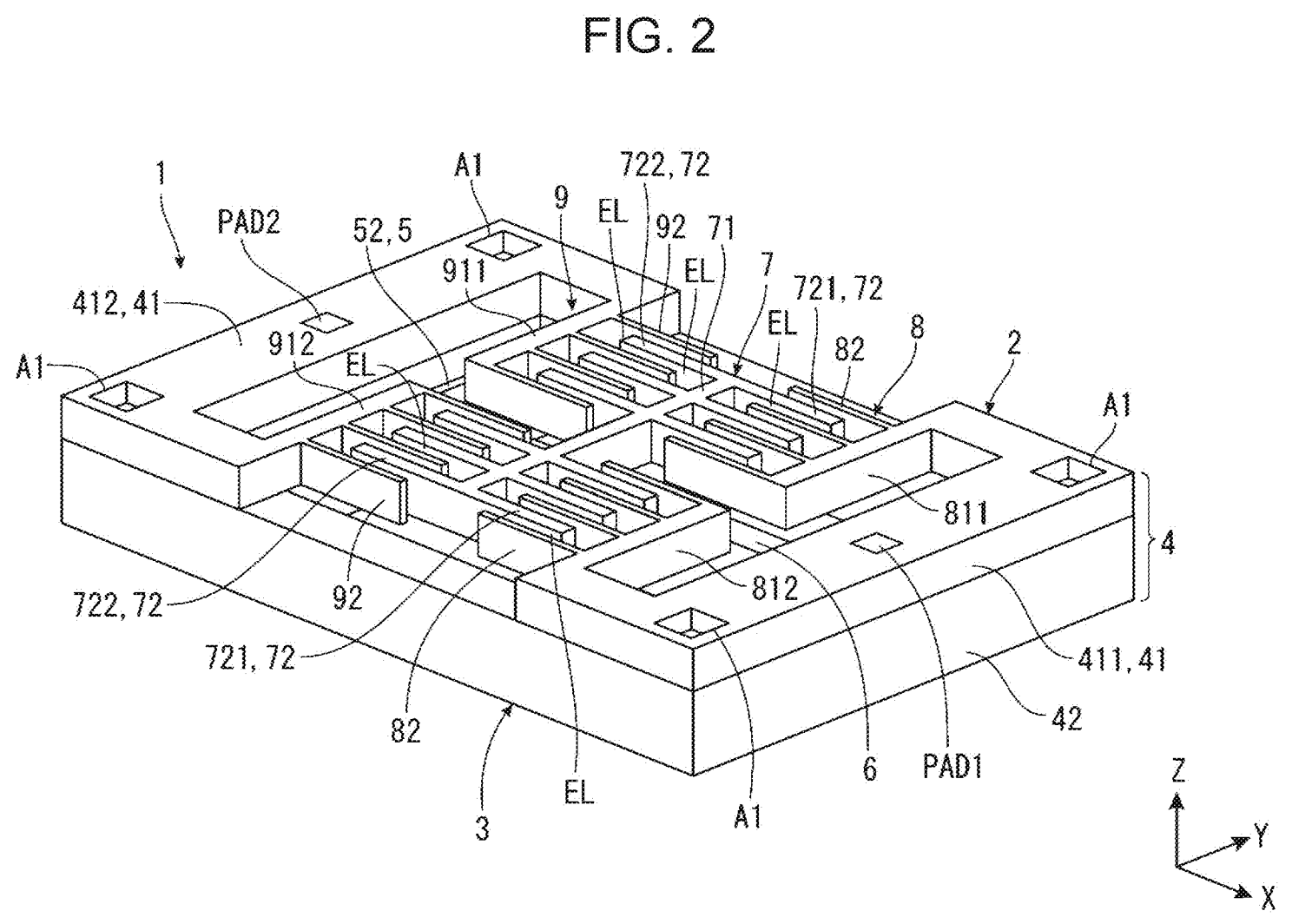

FIG. 2 is a perspective view of the vibration power generation device of FIG. 1.

FIG. 7 is a sectional view for describing the method for manufacturing a vibration power generation device.

FIG. 8 is a sectional view for describing the method for manufacturing a vibration power generation device.

FIG. 9 is a sectional view for describing the method for manufacturing a vibration power generation device.

DESCRIPTION OF EMBODIMENTS

Hereinafter, a method for manufacturing a vibration power generation device of the present disclosure will be described in detail with reference to the accompanying drawings based on an embodiment.

Figure 1:
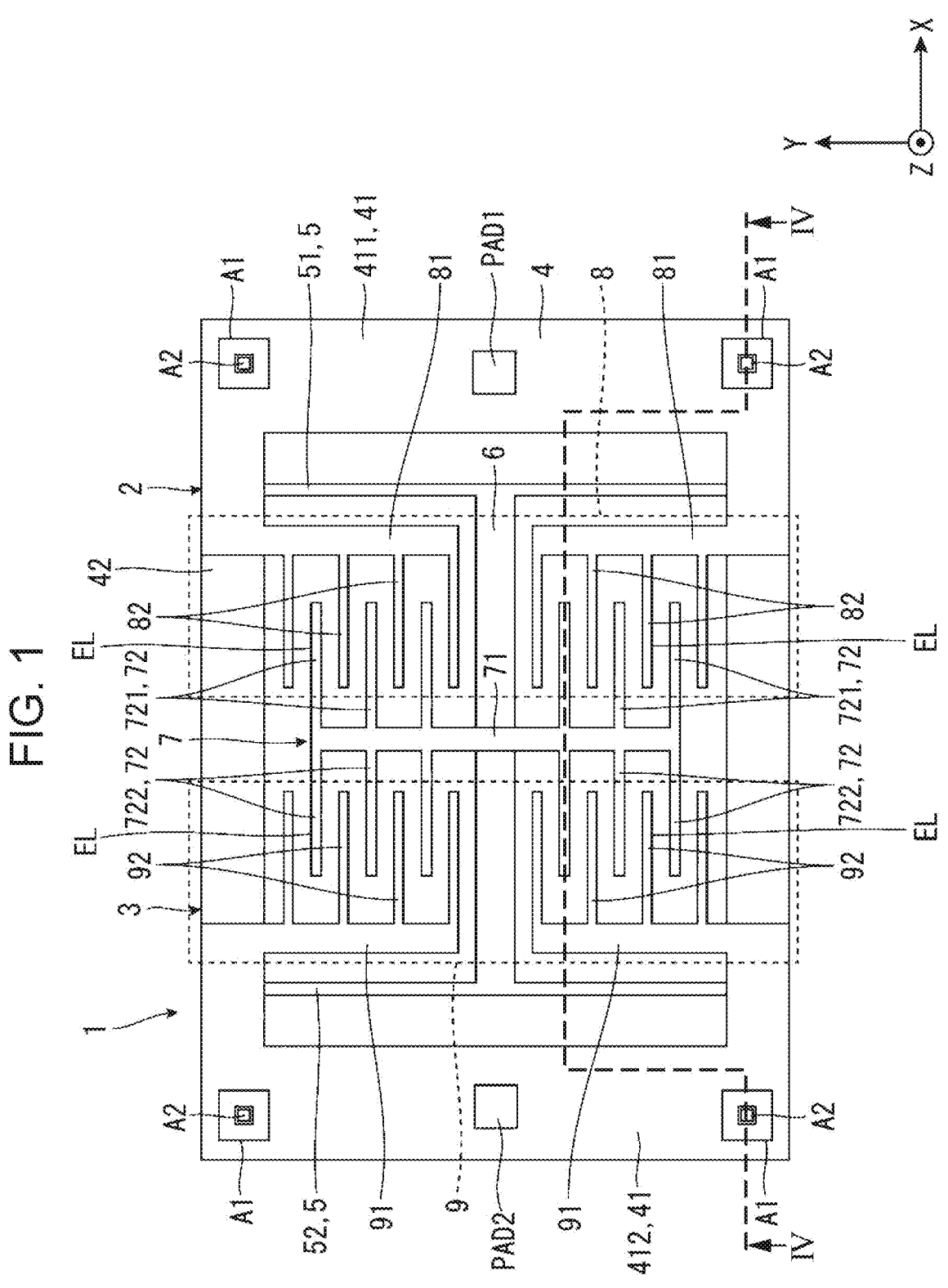
FIG. 1 is a top view illustrating a vibration power generation device according to a preferred embodiment.
Figure 3:
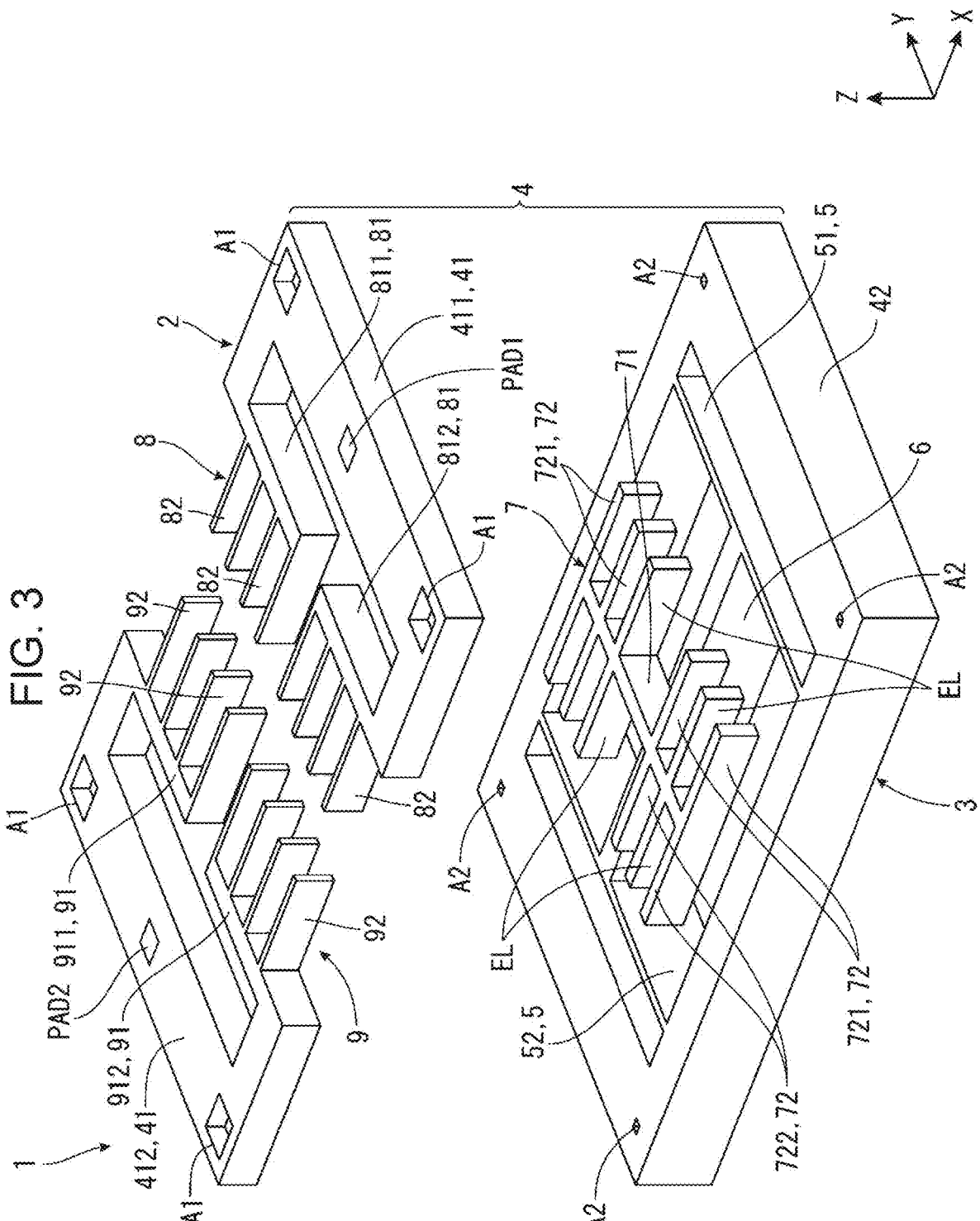
FIG. 3 is an exploded perspective view of the vibration power generation device of FIG. 1.
Figure 4:
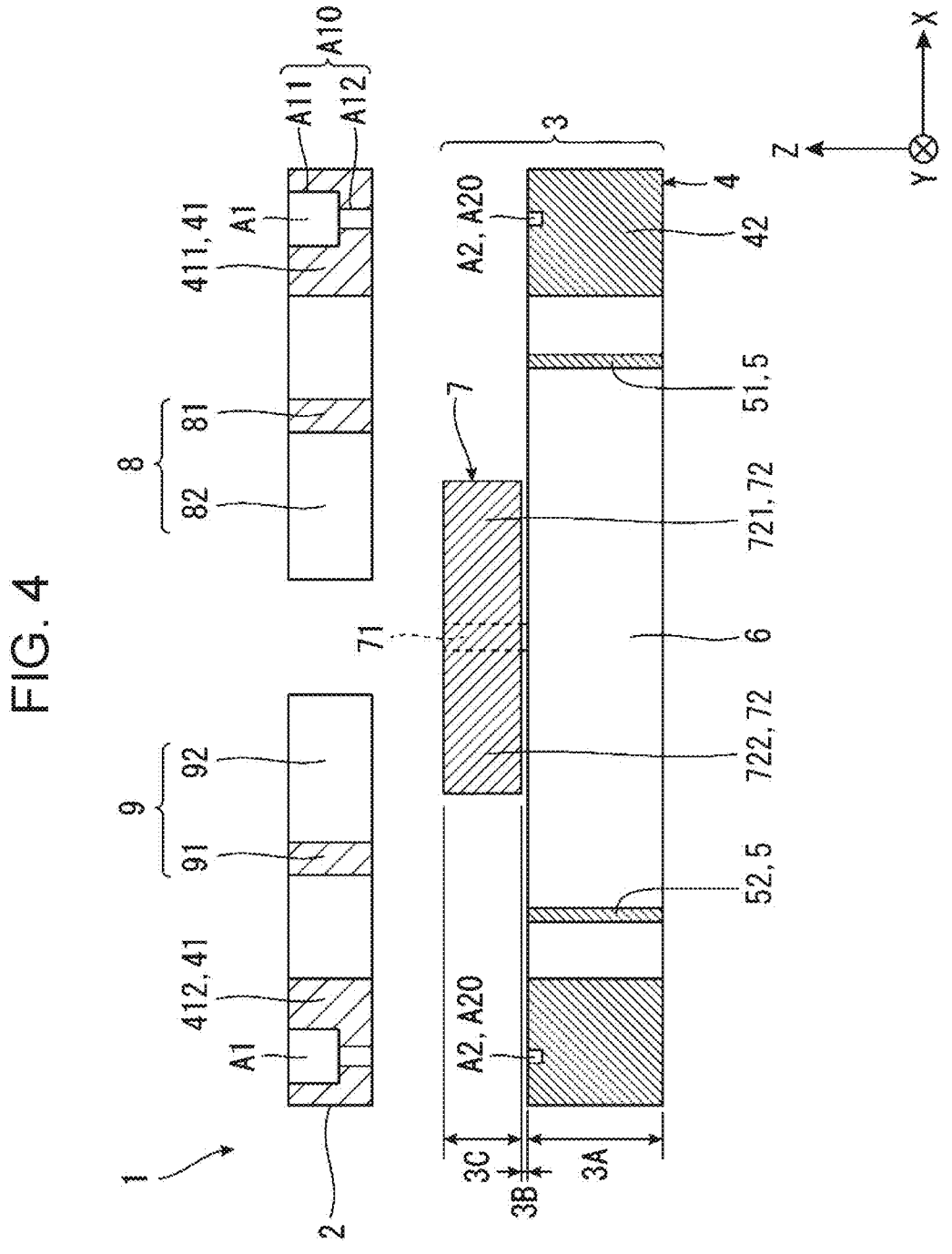
FIG. 4 is a sectional view taken along the line IV-IV in FIG. 1.
Figures 5, 6:
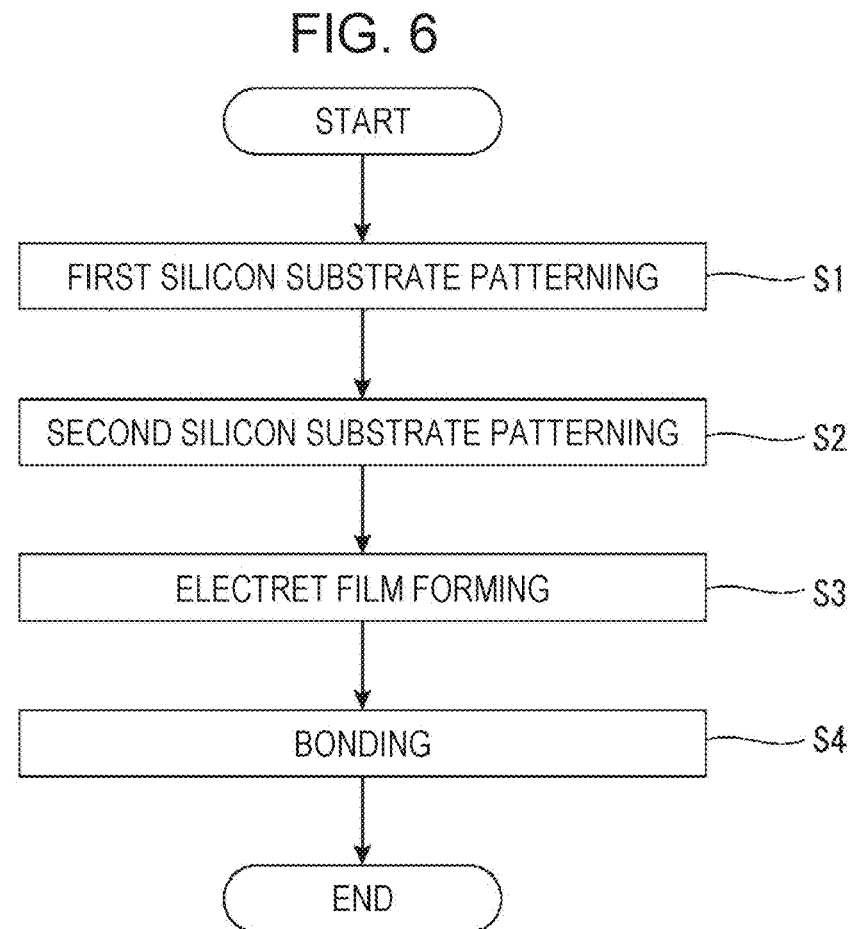
FIG. 5 is a sectional view of a first alignment mark and a second alignment mark.
FIG. 6 is a flowchart illustrating a method for manufacturing a vibration power generation device illustrated in FIG. 1.
Figure 15:
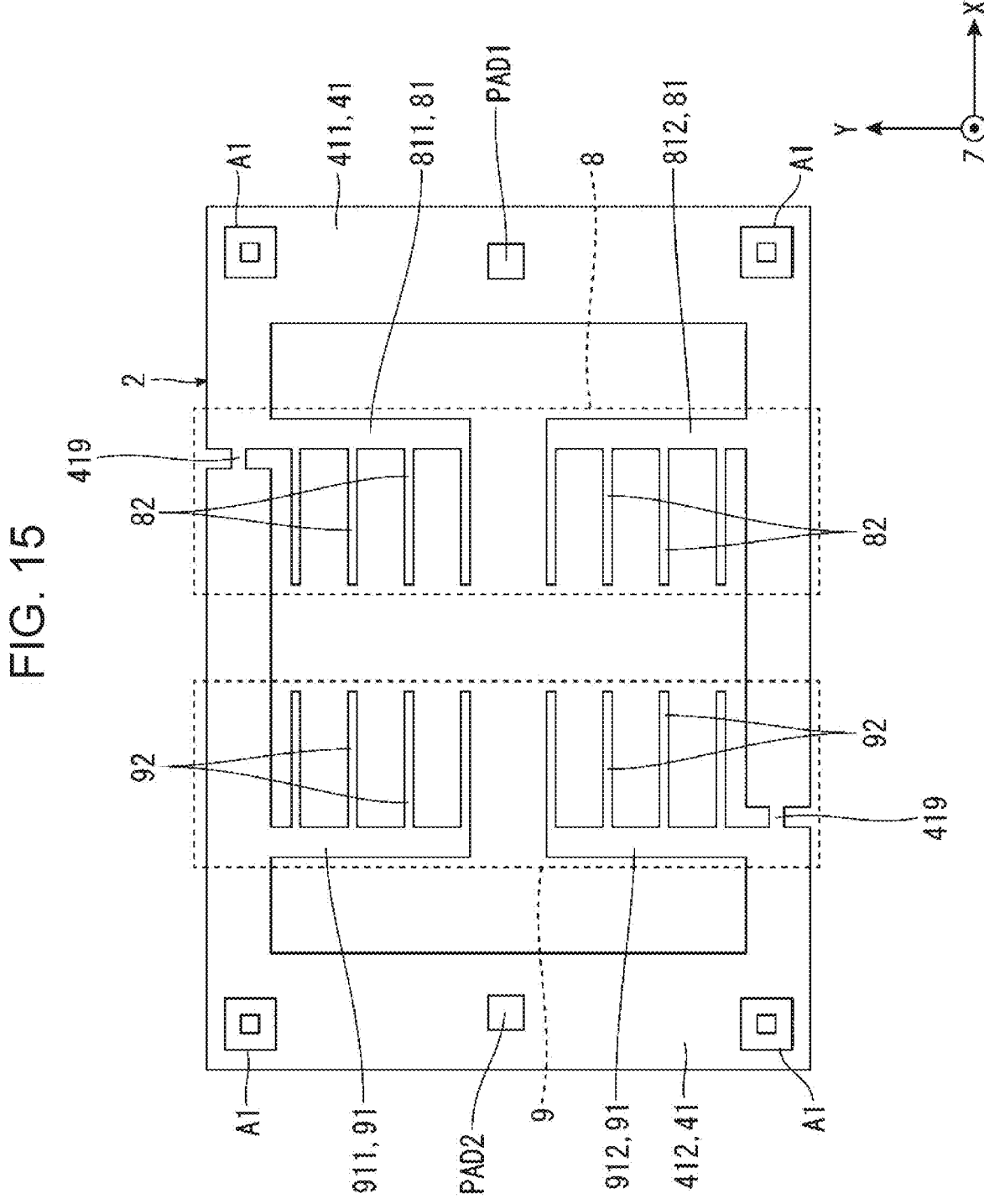
FIG. 15 is a top view illustrating a first silicon substrate according to a modification example of the method for manufacturing a vibration power generation device.

FIG. 1 is a top view illustrating a vibration power generation device according to a preferred embodiment. FIG. 2 is a perspective view of the vibration power generation device of FIG. 1. FIG. 3 is an exploded perspective view of the vibration power generation device of FIG. 1. FIG. 4 is a sectional view taken along the line IV-IV in FIG. 1. FIG. 5 is a sectional view of a first alignment mark and a second alignment mark. FIG. 6 is a flowchart illustrating a method for manufacturing a vibration power generation device illustrated in FIG. 1. FIGS. 7 to 14 are sectional views for describing the method for manufacturing a vibration power generation device, respectively. FIG. 15 is a top view illustrating a first silicon substrate according to a modification example of the method for manufacturing a vibration power generation device.

In addition, in the following, for convenience of description, three axes orthogonal to each other are referred to as an X axis, a Y axis, and a Z axis. In addition, a direction along the X axis is referred to as an X-axis direction, a direction along the Y axis is referred to as a Y-axis direction, and a direction along the Z axis is referred to as a Z-axis direction. In addition, the arrow side of each axis is referred to as a positive side, and the opposite side is referred to as a negative side. In addition, the positive side in the Z-axis direction is referred to as an upper side, and the negative side in the Z-axis direction is referred to as a lower side.

The vibration power generation device 1 illustrated in FIGS. 1 to 3 is an electrostatic induction type vibration power generation element, and is driven by an external force to generate power. The vibration power generation device 1 is manufactured by bonding a first silicon substrate 2 patterned by a semiconductor process and a silicon on insulator (SOI) substrate 3 which is a second silicon substrate patterned by a semiconductor process.

The first silicon substrate 2 is a double-sided mirror silicon substrate. In addition, the thickness of the first silicon substrate 2 is approximately 200 μm or more and 300 μm or less.

As illustrated in FIG. 4, the SOI substrate 3 is a substrate in which a silicon oxide layer 3B is inserted between a first silicon layer 3A and a second silicon layer 3C. The first silicon layer 3A is also referred to as a handle layer, the second silicon layer 3C is also referred to as a device layer, and the silicon oxide layer 3B is also referred to as a BOX layer. In addition, the thickness of the first silicon layer 3A is 200 μm or more and 500 μm or less, the thickness of the silicon oxide layer 3B is approximately 1 μm, and the thickness of the second silicon layer 3C is the same as the thickness of the first silicon substrate 2, that is, approximately 200 μm or more and 300 μm or less. However, the thicknesses of the respective portions are not particularly limited.

As illustrated in FIGS. 1 to 3, the vibration power generation device 1 includes a support portion 4, a spring portion 5 coupled to the support portion 4, a movable portion 6 coupled to the support portion 4 via the spring portion 5, a movable electrode 7 coupled to the movable portion 6, and a first fixed electrode 8 and a second fixed electrode 9 coupled to the support portion 4. In addition, the movable portion 6 is displaceable with respect to the support portion 4 in the X-axis direction, which is the first direction, while elastically deforming the spring portion 5. In the vibration power generation device 1 having such a configuration, when an external force in the X-axis direction is applied, the movable portion 6 vibrates in the X-axis direction while elastically deforming the spring portion 5, and power generation is performed by changing the capacitance between the movable electrode 7 and the first and second fixed electrodes 8 and 9 due to the vibration.

Support Portion 4

As illustrated in FIG. 4, the support portion 4 is formed of a laminate of a first support portion 41 formed of the first silicon substrate 2, and a second support portion 42 formed of the first silicon layer 3A of the SOI substrate 3.

The second support portion 42 has a frame shape in plan view in the Z-axis direction. Further, second alignment marks A2 are formed at each of the four corners of the second support portion 42. The second alignment mark A2 is used for positioning between the first silicon substrate 2 and the SOI substrate 3. As illustrated in FIG. 5, each second alignment mark A2 is a recess portion A20 that is open on the upper surface of the second support portion 42. Each recess portion A20 is a square in plan view in the Z-axis direction.

However, the number, arrangement, and configuration of the second alignment marks A2 are each not particularly limited. For example, the second alignment mark A2 may be a protrusion protruding from the upper surface of the second silicon layer 3C of the SOI substrate 3 instead of the recess portion, or may be printed on the upper surface of the second silicon layer 3C of the SOI substrate 3. Further, the second alignment mark A2 may be omitted.

As illustrated in FIGS. 1 to 3, the first support portion 41 is divided into a first fixed electrode support portion 411 located on the positive side in the X-axis direction and to which the first fixed electrode 8 is coupled, and a second fixed electrode support portion 412 located on the negative side in the X-axis direction and to which the second fixed electrode 9 is coupled, and the first fixed electrode support portion 411 and the second fixed electrode support portion 412 are insulated from each other. The first fixed electrode support portion 411 is formed with an electrode pad PAD1 for extracting electric charge from the first fixed electrode 8, and the second fixed electrode support portion 412 is formed with an electrode pad PAD2 for extracting electric charge from the second fixed electrode 9.

Further, first alignment marks A1 overlapping with the second alignment marks A2 are formed at each of the four corners of the first support portion 41. The first alignment mark A1 is used for positioning the first silicon substrate 2 and the SOI substrate 3.

As illustrated in FIG. 5, each first alignment mark A1 is a through-hole A10 penetrating the first silicon substrate 2 in the thickness direction. Therefore, the second alignment mark A2 located on the lower side can be visually recognized through the through-hole A10. Further, the through-hole A10 has a first part A11 that is open on the upper surface of the first silicon substrate 2 and a second part A12 that penetrates the bottom surface of the first part A11 and the lower surface of the first silicon substrate 2. In plan view in the Z-axis direction, the first part A11 and the second part A12 are each a square and are coaxially formed. The second part A12 is smaller than the first part A11, and a step is formed therebetween. That is, the first alignment mark A1 has an opening on the upper surface side of the first silicon substrate 2 larger than an opening on the lower surface side.

With such a configuration, light is easily incident on the first alignment mark A1 from the upper opening, and the first silicon substrate 2 and the SOI substrate 3 can be positioned in a brighter environment, that is, in an environment in which the field of view is sufficiently secured. In addition, the second part A12 is formed to be slightly larger than the second alignment mark A2, and is positioned such that the second alignment mark A2 is positioned at the center portion of the second part A12. Therefore, the first silicon substrate 2 and the SOI substrate 3 can be positioned with high accuracy.

However, the number, arrangement, and configuration of the first alignment marks A1 are each not particularly limited. In addition, the first alignment mark A1 may be omitted.

Movable Portion 6

As illustrated in FIG. 4, the movable portion 6 is formed of the first silicon layer 3A of the SOI substrate 3 and is positioned at the center portion of the vibration power generation device 1 in plan view in the Z-axis direction.

Spring Portion 5

As illustrated in FIG. 4, the spring portion 5 is formed of the first silicon layer 3A of the SOI substrate 3. That is, the spring portion 5 is formed of the same layer as the movable portion 6. Therefore, the spring portion 5 can be arranged near the center of gravity of the movable portion 6, and the unnecessary displacement of the movable portion 6, that is, the displacement in a direction other than the X-axis direction can be effectively suppressed. As illustrated in FIGS. 1 and 3, the spring portion 5 includes a first spring portion 51 that couples the end portion of the movable portion 6 on the positive side in the X-axis direction to the second support portion 42, and a second spring portion 52 that couples the end portion of the movable portion 6 on the negative side in the X-axis direction to the second support portion 42. The first spring portion 51 and the second spring portion 52 each have a beam shape extending in the Y-axis direction and are elastically deformed in the X-axis direction. As described above, the movable portion 6 can be stably vibrated in the X-axis direction by supporting the movable portion 6 from both sides in the X-axis direction by the first spring portion 51 and the second spring portion 52.

However, the configuration of the spring portion 5 is not particularly limited as long as the movable portion 6 is displaceable with respect to the support portion 4 in the X-axis direction.

Movable Electrode 7

As illustrated in FIG. 4, the movable electrode 7 is formed of the second silicon layer 3C of the SOI substrate 3. In addition, as illustrated in FIGS. 1 to 3, the movable electrode 7 overlaps with the movable portion 6 in plan view in the Z-axis direction. As described above, by arranging the movable electrode 7 and the movable portion 6 to be overlapped in the Z-axis direction, the size of the movable portion 6 can be enlarged and the mass thereof can be increased without increasing the planar dimension of the vibration power generation device 1. Therefore, the sensitivity of the vibration power generation device 1 is improved, and the movable portion 6 can be efficiently vibrated even in a low frequency band. Further, since the movable electrode 7 and the first and second fixed electrodes 8 and 9 can be formed over a wide range regardless of the size of the movable portion 6, the capacitance between the movable electrode 7 and the first and second fixed electrodes 8 and 9 can be increased. Therefore, the amount of power generated by the vibration power generation device 1 can be increased.

The movable electrode 7 has a comb shape, and includes an electrode finger support portion 71 coupled to the movable portion 6 via the silicon oxide layer 3B, and a plurality of movable electrode fingers 72 extending from the electrode finger support portion 71. The electrode finger support portion 71 extends in the Y-axis direction. On the other hand, the plurality of movable electrode fingers 72 include a plurality of first movable electrode fingers 721 extending from the electrode finger support portion 71 to the positive side in the X-axis direction and arranged at equal intervals in the Y-axis direction, and a plurality of second movable electrode fingers 722 extending from the electrode finger support portion 71 to the negative side in the X-axis direction and arranged at equal intervals in the Y-axis direction.

In addition, an electret film EL is formed at the surface of the first and second movable electrode fingers 721 and 722, particularly, on the side surfaces facing the first and second fixed electrode fingers 82 and 92 to be described later. The electret film EL is, for example, one in which a silicon oxide layer formed by thermally oxidizing the first and second movable electrode fingers 721 and 722 is negatively charged. The electret film EL may be formed at the first and second fixed electrode fingers 82 and 92 instead of the first and second movable electrode fingers 721 and 722. However, as in the present embodiment, it is preferable to form the electret film EL on the first and second movable electrode fingers 721 and 722. By forming the electret film EL on the first and second movable electrode fingers 721 and 722, which are the sides that are displaced with respect to the support portion 4, electric charge generated during power generation can be extracted from the first and second fixed electrode fingers 82 and 92, which are the sides that are fixed to the support portion 4. Therefore, the extraction of electric charge becomes easier.

First and Second Fixed Electrodes 8 and 9

As illustrated in FIGS. 1 to 3, the first fixed electrode 8 and the second fixed electrode 9 are formed from the first silicon substrate 2, respectively. In addition, the first fixed electrode 8 and the second fixed electrode 9 are arranged not to overlap with the movable portion 6 and the spring portion 5, respectively, in plan view in the Z-axis direction. As a result, the contact between the first and second fixed electrodes 8 and 9 and the movable portion 6 and the spring portion 5 can be suppressed.

The first fixed electrode 8 has a comb shape, and includes an electrode finger support portion 81 coupled to the first fixed electrode support portion 411 and a plurality of first fixed electrode fingers 82 as fixed electrode fingers extending from the electrode finger support portion 81. The electrode finger support portion 81 includes a first electrode finger support portion 811 located on the positive side in the Y-axis direction from the movable portion 6 and a second electrode finger support portion 812 located on the negative side in the Y-axis direction from the movable portion 6, in plan view in the Z-axis direction, not to overlap with the movable portion 6. The first and second electrode finger support portions 811 and 812 are arranged on a straight line along the Y-axis direction, and an end portion of the first electrode finger support portion 811 on the positive side in the Y-axis direction and an end portion of the second electrode finger support portion 812 on the negative side in the Y-axis direction are respectively coupled to the first fixed electrode support portion 411. The plurality of first fixed electrode fingers 82 extend from the first and second electrode finger support portions 811 and 812 to the negative side in the X-axis direction and are arranged at equal intervals in the Y-axis direction. The plurality of first fixed electrode fingers 82 and the plurality of first movable electrode fingers 721 have a predetermined meshing length in the X-axis direction and face each other with a gap in the Y-axis direction in the stationary state.

The second fixed electrode 9 is formed symmetrically with the first fixed electrode 8. The second fixed electrode 9 has a comb shape, and includes an electrode finger support portion 91 coupled to the second fixed electrode support portion 412, and a plurality of second fixed electrode fingers 92 as fixed electrode fingers extending from the electrode finger support portion 91. The electrode finger support portion 91 includes a first electrode finger support portion 911 located on the positive side in the Y-axis direction from the movable portion 6 and a second electrode finger support portion 912 located on the negative side in the Y-axis direction from the movable portion 6, in plan view in the Z-axis direction, not to overlap with the movable portion 6. The first and second electrode finger support portions 911 and 912 are arranged on a straight line along the Y-axis direction, and an end portion of the first electrode finger support portion 911 on the positive side in the Y-axis direction and an end portion of the second electrode finger support portion 912 on the negative side in the Y-axis direction are respectively coupled to the second fixed electrode support portion 412. The plurality of second fixed electrode fingers 92 extend from the first and second electrode finger support portions 911 and 912 to the positive side in the X-axis direction and are arranged at equal intervals in the Y-axis direction. The plurality of second fixed electrode fingers 92 and the plurality of second movable electrode fingers 722 have a predetermined meshing length in the X-axis direction and face each other with a gap in the Y-axis direction in the stationary state.

The configuration of the vibration power generation device 1 is briefly described above. In the vibration power generation device 1 having such a configuration, when a force in the X-axis direction is applied, the movable portion 6 vibrates in the X-axis direction while the first and second spring portions 51 and 52 are elastically deformed. The vibration of the movable portion 6 causes the meshing length between the first and second movable electrode fingers 721 and 722 and the first and second fixed electrode fingers 82 and 92 to change in opposite phases, and thus power generation is performed. Specifically, when the movable portion 6 is displaced to the positive side in the X-axis direction, in the first fixed electrode finger 82, the meshing length with the first movable electrode finger 721 increases and positive electric charge is charged, and in the second fixed electrode finger 92, the meshing length with the second movable electrode finger 722 decreases and electric charge is discharged. On the other hand, when the movable portion 6 is displaced to the negative side in the X-axis direction, in the first fixed electrode finger 82, the meshing length with the first movable electrode finger 721 decreases, and thus the charged electric charge is discharged, and in the second fixed electrode finger 92, the meshing length with the second movable electrode finger 722 increases, and thus the positive electric charge is charged. As described above, the charging and discharging of the electric charge between the first and second fixed electrode fingers 82 and 92 are repeated in opposite phases.

By repeating the charging and discharging of the electric charge in the first and second fixed electrode fingers 82 and 92, a current flows from the vibration power generation device 1 to a rectifier circuit side (not illustrated). This current is rectified by a rectifier circuit and is input to the secondary battery. As a result, the power generated by the vibration power generation device 1 is stored in the secondary battery. The power accumulated in the secondary battery is supplied to the load as necessary. The secondary battery is a rechargeable battery such as a lithium secondary battery. The load is, for example, a circuit for realizing the function of a portable electric device, and operates by consuming power supplied from the secondary battery. For example, when the portable electric device is a wristwatch, the load includes a time measurement circuit and the like, and performs various controls such as time measurement of the current time.

Next, a method for manufacturing a vibration power generation device 1 will be described. As illustrated in FIG. 6, the method for manufacturing a vibration power generation device 1 includes first silicon substrate patterning S1 for patterning the first silicon substrate 2 by etching to form the first support portion 41 and the first and second fixed electrodes 8 and 9; second silicon substrate patterning S2 for patterning the second silicon layer 3C of the SOI substrate 3 by etching to form the movable electrode 7 and patterning the first silicon layer 3A by etching to form the second support portion 42 and the movable portion 6; electret film forming S3 for forming the electret film EL at the movable electrode 7; and bonding S4 for bonding the first silicon substrate 2 to the SOI substrate 3.

First Silicon Substrate Patterning S1

In the first silicon substrate patterning S1, first, the first silicon substrate 2 is prepared as illustrated in FIG. 7. The first silicon substrate 2 is a double-sided mirror silicon substrate, and has a thickness of approximately 200 μm or more and 300 μm or less. Next, as illustrated in FIG. 8, the first silicon substrate 2 is patterned by etching to form the first alignment mark A1. Next, as illustrated in FIG. 9, the first silicon substrate 2 is patterned by etching to form the first support portion 41 and the first and second fixed electrodes 8 and 9. Specifically, a part in which the first fixed electrode support portion 411 and the first fixed electrode 8 are integrally formed and a part in which the second fixed electrode support portion 412 and the second fixed electrode 9 are integrally formed are formed.

The etching method is not particularly limited, but dry etching, particularly reactive ion etching (RIE) is preferably used. Since the through-holes having a high aspect ratio can be formed with high accuracy by using dry etching, more detailed processing can be performed.

Second Silicon Substrate Patterning S2

Figure 10:
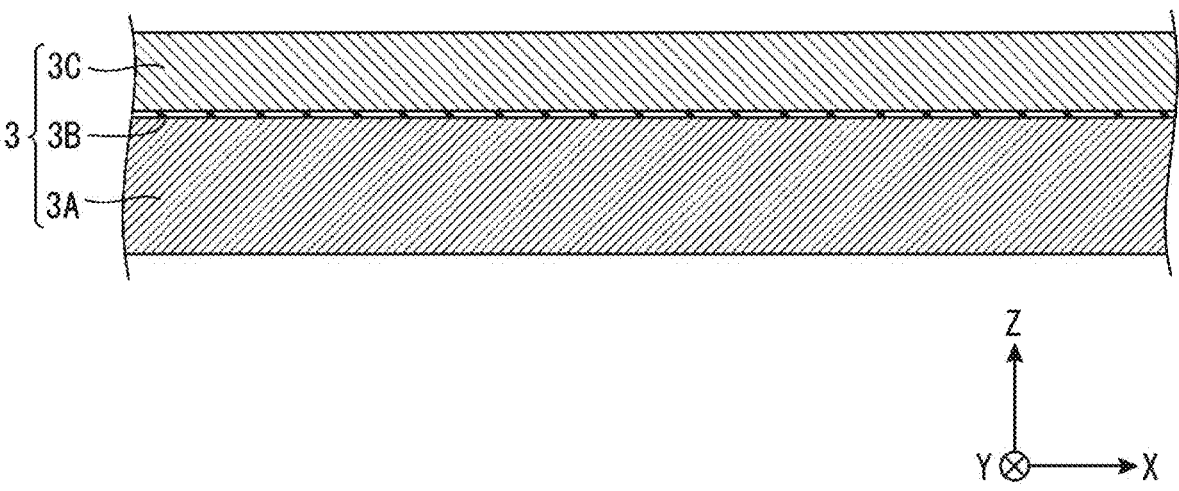
FIG. 10 is a sectional view for describing the method for manufacturing a vibration power generation device.

In the second silicon substrate patterning S2, first, as illustrated in FIG. 10, the SOI substrate 3 as the second silicon substrate is prepared. The SOI substrate 3 is a substrate in which the silicon oxide layer 3B is inserted between the first silicon layer 3A and the second silicon layer 3C, the first silicon layer 3A has a thickness of 200 μm or more and 500 μm or less, the silicon oxide layer 3B has a thickness of approximately 1 μm, and the second silicon layer 3C has the same thickness as the first silicon substrate 2. As described above, the SOI substrate 3 is used as the second silicon substrate, and thus the silicon oxide layer 3B functions as an etching stop layer. Therefore, the first silicon layer 3A and the second silicon layer 3C can be etched independently, and the present process S2 can be performed with high accuracy.

Figure 11:
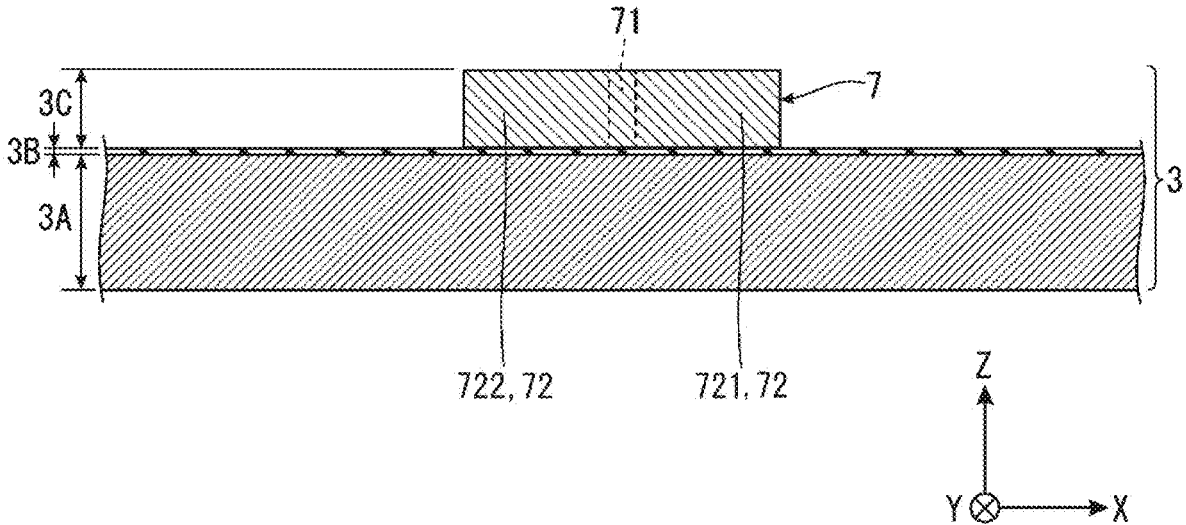
FIG. 11 is a sectional view for describing the method for manufacturing a vibration power generation device.
Figures 12, 13, 14:
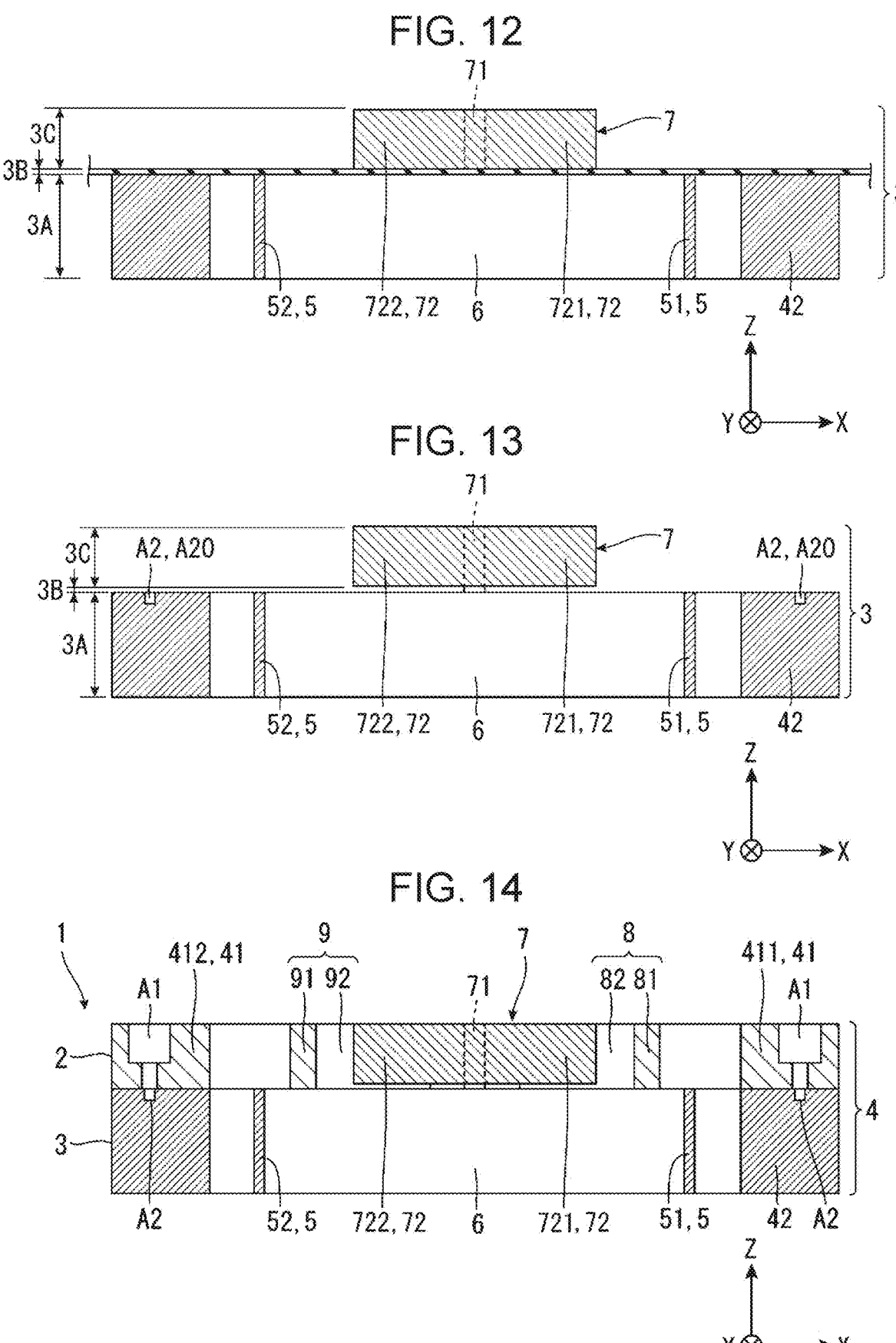
FIG. 12 is a sectional view for describing the method for manufacturing a vibration power generation device.
FIG. 13 is a sectional view for describing the method for manufacturing a vibration power generation device.
FIG. 14 is a sectional view for describing the method for manufacturing a vibration power generation device.

Next, as illustrated in FIG. 11, the second silicon layer 3C is patterned by etching from the upper surface side to form the movable electrode 7. At this time, the silicon oxide layer 3B functions as an etching stop layer. Next, as illustrated in FIG. 12, the first silicon layer 3A is patterned by etching from the lower surface side to form the second support portion 42, the spring portion 5, and the movable portion 6. Next, after the exposed silicon oxide layer 3B is etched and removed from the second silicon layer 3C, the first silicon layer 3A is patterned by etching to form the second alignment mark A2 as illustrated in FIG. 13.

The etching method is not particularly limited, but dry etching, particularly reactive ion etching (RIE) is preferably used. Since the through-holes having a high aspect ratio can be formed with high accuracy by using dry etching, more detailed processing can be performed.

Further, the second silicon substrate patterning S2 may be performed before the first silicon substrate patterning S1, or may be performed in parallel.

Electret Film Forming S3

In the electret film forming S3, the electret film EL is formed at the first and second movable electrode fingers 721 and 722. In the present embodiment, first, the SOI substrate 3 is thermally oxidized to form a silicon oxide film on the surfaces of the first and second movable electrode fingers 721 and 722. The silicon oxide film is doped with an alkali ion such as a potassium ion, and then the alkali ion is removed from the silicon oxide film by applying an electric field to charge the silicon oxide film.

However, the method for forming the electret film EL is not particularly limited. For example, the method may be a method for charging by forming a silicon oxide film containing alkali ions on the surfaces of the first and second movable electrode fingers 721 and 722 by thermally oxidizing the first and second movable electrode fingers 721 and 722 in a state where the alkali ions are fixed to the surfaces of the first and second movable electrode fingers 721 and 722 by spray coating or the like, and then removing the alkali ions from the silicon oxide film by applying an electric field.

In the present embodiment, the electret film EL is formed at the first and second movable electrode fingers 721 and 722, but the present disclosure is not limited thereto, and the electret film EL may be formed at the first and second fixed electrode fingers 82 and 92. Further, when the electret film EL is formed at the first and second fixed electrode fingers 82 and 92, the electret film forming S3 may be performed before the second silicon substrate patterning S2.

Bonding S4

In the bonding S4, as illustrated in FIG. 14, the first silicon substrate and the SOI substrate 3 are bonded such that the first and second movable electrode fingers 721 and 722 and the first and second fixed electrode fingers 82 and 92 mesh with each other. Specifically, the lower surfaces of the first fixed electrode support portion 411 and the second fixed electrode support portion 412 are bonded to the upper surface of the second support portion 42, respectively. As a result, the support portion 4 is obtained, which is formed of a laminate of the first support portion 41 and the second support portion 42. As a result, the vibration power generation device 1 is manufactured. Although not illustrated, a thermally oxidized film is also formed at the upper surface of the second support portion 42 by thermal oxidation in the electret film forming S3. Therefore, the thermally oxidized film is interposed between the first support portion 41 and the second support portion 42, and the first support portion 41 and the second support portion 42 are insulated.

In the present process, the first silicon substrate 2 and the SOI substrate 3 are positioned based on the first alignment mark A1 formed at the first support portion 41 and the second alignment mark A2 formed at the second support portion 42. Therefore, the positioning of the first silicon substrate 2 and the SOI substrate 3 becomes easier. Specifically, in plan view in the Z-axis direction, the first fixed electrode support portion 411 and the second fixed electrode support portion 412 are positioned with respect to the SOI substrate 3 such that each second alignment mark A2 overlaps with the corresponding first alignment mark A1 and the second alignment mark A2 is positioned at the center of the second part A12 of the first alignment mark A1. Therefore, the first silicon substrate 2 and the SOI substrate 3 can be positioned with high accuracy.

The method for bonding the first fixed electrode support portion 411 and the second fixed electrode support portion 412 to the SOI substrate 3 is not particularly limited, and for example, bonding may be performed using an adhesive, or direct bonding may be used. As the direct bonding, for example, room temperature bonding such as surface activation bonding may be used.

As described above, in the method for manufacturing a vibration power generation device 1 of the present embodiment, the movable electrode 7 and the first and second fixed electrodes 8 and 9 are formed at separate substrates by dividing the first silicon substrate patterning S1 and the second silicon substrate patterning S2. Therefore, the electret film EL can be easily formed only at the movable electrode 7. Further, by forming the movable electrode 7 and the first and second fixed electrodes 8 and 9 on separate substrates, the separation distance between the first movable electrode finger 721 and the first fixed electrode finger 82 and the separation distance between the second movable electrode finger 722 and the second fixed electrode finger 92 can be made smaller than when the movable electrode 7 and the first and second fixed electrodes 8 and 9 are formed at one substrate. Therefore, the capacitance between the movable electrode 7 and the first and second fixed electrodes 8 and 9 can be increased, and amount of the power generation is increased.

The method for manufacturing a vibration power generation device 1 is described above. The method for manufacturing a vibration power generation device 1 including the support portion 4 having the first support portion 41 and the second support portion 42, the movable portion 6 that is displaced in the X-axis direction, which is a first direction, with respect to the support portion 4, the movable electrode finger 72 coupled to the movable portion 6, and the first and second fixed electrode fingers 82 and 92, which are fixed electrode fingers coupled to the support portion 4, the method includes: the first silicon substrate patterning S1 for patterning the first silicon substrate 2 by etching to form the first support portion 41 and the first and second fixed electrode fingers 82 and 92; the second silicon substrate patterning S2 for patterning the second silicon layer 3C of the SOI substrate 3 in which the first silicon layer 3A and the second silicon layer 3C are laminated by etching to form the movable electrode finger 72 and patterning the first silicon layer 3A by etching to form the second support portion 42 and the movable portion 6; the electret film forming S3 for forming the electret film EL at one of the movable electrode finger 72 and the first and second fixed electrode fingers 82 and 92; and the bonding S4 for bonding the first silicon substrate 2 to the second silicon layer 3C side of the SOI substrate 3 such that the movable electrode finger 72 and the first and second fixed electrode fingers 82 and 92 face each other. In such a manufacturing method, the movable electrode finger 72 and the first and second fixed electrode fingers 82 and 92 are formed at separate substrates by dividing the first silicon substrate patterning S1 and the second silicon substrate patterning S2. Therefore, the electret film EL can be easily selectively formed only at one of the movable electrode finger 72 and the first and second fixed electrode fingers 82 and 92.

In addition, as described above, the second silicon substrate is the SOI substrate 3 in which the silicon oxide layer 3B is interposed between the first silicon layer 3A and the second silicon layer 3C. As described above, the SOI substrate 3 is used as the second silicon substrate, and thus the silicon oxide layer 3B functions as an etching stop layer. Therefore, the first silicon layer 3A and the second silicon layer 3C can be etched independently, and the second silicon substrate patterning S2 can be performed with high accuracy.

Further, as described above, in the second silicon substrate patterning S2, the first silicon layer 3A is patterned by etching to form the spring portion 5 that couples the second support portion 42 with the movable portion 6. As a result, the movable portion 6 is supported to be displaceable with respect to the support portion 4. In particular, by forming the spring portion 5 in the same layer as the movable portion 6, the spring portion 5 can be arranged near the center of gravity of the movable portion 6. Therefore, unnecessary displacement of the movable portion 6, that is, displacement in a direction other than the X-axis direction can be effectively suppressed.

Further, as described above, the first alignment mark A1 is formed at the first support portion 41, and the second alignment mark A2 is formed at the second support portion 42. In the bonding S4, the first silicon substrate 2 and the SOI substrate 3 are positioned based on the first alignment mark A1 and the second alignment mark A2. Accordingly, the positioning of the first silicon substrate 2 and the SOI substrate 3 becomes easier.

Further, as described above, the first alignment mark A1 is the through-hole A10 penetrating the first support portion 41. In the bonding S4, the first silicon substrate 2 and the SOI substrate 3 are positioned such that the through-hole A10 and the second alignment mark A2 overlap with each other. As a result, the first silicon substrate 2 and the SOI substrate 3 can be positioned with high accuracy.

Further, as described above, in the electret film forming S3, the electret film EL is formed at the movable electrode finger 72. As described above, by forming the electret film EL at the movable electrode finger 72 which is the side that is displaced with respect to the support portion 4, the electric charge at the time of power generation can be extracted from the first and second fixed electrode fingers 82 and 92 that are the sides fixed to the support portion 4. Therefore, the extraction of electric charge becomes easier.

The method for manufacturing a vibration power generation device of the present disclosure is described above based on the illustrated embodiment, but the present disclosure is not limited thereto, and the configuration of each portion can be replaced with any configuration or any process having the same function. In addition, the present disclosure may be added with any other component or any process.

In addition, in the above-described embodiment, in the first silicon substrate patterning S1, a part where the first fixed electrode support portion 411 and the first fixed electrode 8 are integrally formed and a part where the second fixed electrode support portion 412 and the second fixed electrode 9 are integrally formed are separately formed. Therefore, in the bonding S4, it is necessary to position the two members with respect to the SOI substrate 3 separately. Therefore, there is a concern that positioning may take time.

Therefore, for example, as illustrated in FIG. 15, in the first silicon substrate patterning S1, a coupling beam 419 that couples a part where the first fixed electrode support portion 411 and the first fixed electrode 8 are integrally formed and a part where the second fixed electrode support portion 412 and the second fixed electrode 9 are integrally formed may be formed. According to such a method, in the bonding S4, these can be collectively positioned with respect to the SOI substrate 3. Therefore, the time required for positioning can be shortened. In this case, after the bonding S4 is ended, for example, the vibration power generation device 1 is obtained by cutting the coupling beam 419 by etching, laser irradiation, or the like to separate and insulate the part where the first fixed electrode for the first fixed electrode support portion 411 and the first fixed electrode 8 are integrally formed and the part where the second fixed electrode support portion 412 and the second fixed electrode 9 are integrally formed.

What is claimed is:

1. A method for manufacturing a vibration power generation device including a support portion having a first support portion and a second support portion, a movable portion that is displaced in a first direction with respect to the support portion, a movable electrode finger coupled to the movable portion, and a fixed electrode finger coupled to the support portion, the method comprising:

first silicon substrate patterning for patterning a first silicon substrate by etching to form the first support portion and the fixed electrode finger;

second silicon substrate patterning for patterning a second silicon layer of a second silicon substrate in which a first silicon layer and the second silicon layer are laminated by etching to form the movable electrode finger and patterning the first silicon layer by etching to form the second support portion and the movable portion;

electret film forming for forming an electret film at one of the movable electrode finger and the fixed electrode finger; and bonding for bonding the first silicon substrate to the second silicon layer side of the second silicon substrate such that the movable electrode finger and the fixed electrode finger face each other.

2. The method for manufacturing a vibration power generation device according to claim 1, wherein the second silicon substrate is an SOI substrate in which a silicon oxide layer is interposed between the first silicon layer and the second silicon layer.

3. The method for manufacturing a vibration power generation device according to claim 1, wherein in the second silicon substrate patterning, the first silicon layer is patterned by etching to form a spring portion that couples the second support portion with the movable portion.

4. The method for manufacturing a vibration power generation device according to claim 1, wherein a first alignment mark is formed at the first support portion, a second alignment mark is formed at the second support portion, and in the bonding, the first silicon substrate and the second silicon substrate are positioned based on the first alignment mark and the second alignment mark.

5. The method for manufacturing a vibration power generation device according to claim 4, wherein the first alignment mark is a through-hole penetrating the first support portion, and in the bonding, the first silicon substrate and the second silicon substrate are positioned such that the through-hole and the second alignment mark overlap with each other.

6. The method for manufacturing a vibration power generation device according to claim 1, wherein in the electret film forming, the electret film is formed at the movable electrode finger.

7. A vibration device comprising:

a support portion having a first support portion and a second support portion;

a movable portion that is displaced in a first direction with respect to the support portion;

a movable electrode finger coupled to the movable portion; and a fixed electrode finger coupled to the support portion, wherein the first support portion and the fixed electrode finger are provided on a first silicon substrate, the movable electrode finger is provided on a first silicon layer in a second silicon substrate on which the first silicon layer and a second silicon layer are laminated, and the second support portion and the movable portion are provided on the second silicon layer in the second silicon substrate.

* * * * *